United States Patent
Masuda

(10) Patent No.: US 7,608,481 B2
(45) Date of Patent: Oct. 27, 2009

(54) METHOD FOR PRODUCING SEMICONDUCTOR PACKAGE

(75) Inventor: Takatoshi Masuda, Tokyo (JP)

(73) Assignee: Disco Corporation, Tokyo (JP)

( * ) Notice: Subject to any disclaimer, the term of this patent is extended or adjusted under 35 U.S.C. 154(b) by 418 days.

(21) Appl. No.: 11/715,999

(22) Filed: Mar. 9, 2007

(65) Prior Publication Data
US 2007/0218593 A1 Sep. 20, 2007

(30) Foreign Application Priority Data
Mar. 14, 2006 (JP) .............................. 2006-068458

(51) Int. Cl.
*H01L 21/00* (2006.01)
(52) U.S. Cl. ........................ 438/109; 438/113; 438/460; 257/E25.006; 257/E25.013; 257/E25.018; 257/E25.021; 257/E25.027
(58) Field of Classification Search ................ 438/109, 438/113, 460
See application file for complete search history.

(56) References Cited
U.S. PATENT DOCUMENTS
2006/0057776 A1 * 3/2006 Tao ............................ 438/109

2007/0007247 A1  1/2007  Sekiya
* cited by examiner

Primary Examiner—David A Zarneke
(74) Attorney, Agent, or Firm—Smith, Gambrell & Russell, LLP

(57) ABSTRACT

A method for producing a semiconductor package including a main semiconductor chip having a semiconductor circuit formed on one surface thereof, at least one subsidiary semiconductor chip stacked on the other surface of the main semiconductor chip, and an encapsulation resin covering the subsidiary semiconductor chip. This method comprises a semiconductor wafer preparation step of preparing a semiconductor wafer, on whose one surface many rectangular regions are defined by streets, and in each of the rectangular regions of which a semiconductor circuit constituting the main semiconductor chip is disposed; a circular concavity formation step of forming a circular concavity in the other surface of the semiconductor wafer; a semiconductor chip stacking step of stacking at least one such subsidiary semiconductor chip on each of many rectangular regions on the bottom surface of the circular concavity; an encapsulation resin formation step of filling a molten resin into the circular concavity, and curing the resin, thereby forming an encapsulation resin covering the subsidiary semiconductor chips; and a separation step of cutting the encapsulation resin, together with the semiconductor wafer, along the streets, to separate the semiconductor wafer and the encapsulation resin into many of the semiconductor packages.

4 Claims, 3 Drawing Sheets

METHOD FOR PRODUCING SEMICONDUCTOR PACKAGE

FIELD OF THE INVENTION

This invention relates to a method for producing a semiconductor package including a main semiconductor chip having a semiconductor circuit formed on one surface thereof, at least one subsidiary semiconductor chip stacked on the other surface of the main semiconductor chip, and an encapsulation resin covering the subsidiary semiconductor chip.

DESCRIPTION OF THE PRIOR ART

As is well known among people skilled in the art, a semiconductor package containing a plurality of semiconductor chips, called a multi-chip package, is put to practical use. A typical example of such a semiconductor package includes a main semiconductor chip having a semiconductor circuit formed on one surface thereof, at least one subsidiary semiconductor chip stacked on the other surface of the main semiconductor chip, and an encapsulation resin covering the subsidiary semiconductor chip. The encapsulation resin is generally formed by covering the subsidiary semiconductor chip with a mold after stacking the subsidiary semiconductor chip on the other surface of the main semiconductor chip; filling a molten resin into the mold; and curing the resin. The mold has a top wall, and a circumferential side wall drooping from the circumferential edge of the top wall. A filling hole and a discharge hole are disposed in the top wall. The molten resin is supplied into the mold through the filling hole, and air in the molding resin and a surplus of the molten resin are discharged through the discharge hole.

However, conventional methods for producing a semiconductor package of the above-described form pose the following problems: A dedicated mold needs to be used to form the encapsulation resin, thus requiring a high cost of production and a complicated method of production. The semiconductor package is desired to be as thin as possible, and thus the thickness of the encapsulation resin is also desired to be as small as possible. If the thickness of a molding space defined in the mold is rendered sufficiently small, however, it becomes difficult to render the molding space full of the resin, without leaving air therein, by filling the resin into the molding space. If air remains in the molding space, air is inflated during heating for curing the resin, thereby incurring the risk of damaging the resin. If the resin is filled into the molding space at a considerably high pressure in order to make the molding space full of the resin, on the other hand, there is the risk of deforming many wires electrically connecting the semiconductor chips, causing wire breakage or short-circuiting.

SUMMARY OF THE INVENTION

It is a principal object of the present invention, therefore, to provide a novel and improved method which can produce a semiconductor package of the above-described form, without requiring a mold, without causing air to remain, and without generating wire breakage or short-circuiting.

According to the present invention, as a method for attaining the above object, there is provided a method for producing a semiconductor package including a main semiconductor chip having a semiconductor circuit formed on one surface thereof, at least one subsidiary semiconductor chip stacked on the other surface of the main semiconductor chip, and an encapsulation resin covering the subsidiary semiconductor chip, comprising:

a semiconductor wafer preparation step of preparing a semiconductor wafer which is generally disk-shaped, on whose one surface a peripheral edge region and a main region surrounded with the peripheral edge region are present, in the main region of which many rectangular regions are defined by streets arranged in a lattice pattern, and in each of the rectangular regions of which a semiconductor circuit constituting the main semiconductor chip is disposed;

a circular concavity formation step of grinding the other surface of the semiconductor wafer, except a peripheral edge region corresponding to the peripheral edge region on the one surface, after the preparation step, thereby forming a circular concavity in the other surface of the semiconductor wafer;

a semiconductor chip stacking step of stacking at least one such subsidiary semiconductor chip on each of many rectangular regions, which corresponds to each of the rectangular regions, on the bottom surface of the circular concavity of the semiconductor wafer after the circular concavity formation step;

an encapsulation resin formation step of filling a molten resin into the circular concavity of the semiconductor wafer, and curing the resin, after the semiconductor chip stacking step, thereby forming an encapsulation resin covering the subsidiary semiconductor chip; and a separation step of cutting the encapsulation resin, together with the semiconductor wafer, along the streets, to separate the semiconductor wafer and the encapsulation resin into many of the semiconductor packages.

It is preferred for the above method to further comprise a via contact means formation step of forming a plurality of penetrating via contact means in each of the rectangular regions prior to the semiconductor chip stacking step. In the via contact means formation step, a plurality of bumps connected to the via contact means can be formed in each of the rectangular regions on the one surface of the semiconductor wafer. It is preferred for the above method to further comprise a wire laying step of connecting the semiconductor circuit of the subsidiary semiconductor chip and the via contact means by electrically conductive wires after the semiconductor chip stacking step and before the encapsulation resin formation step.

DETAILED DESCRIPTION OF THE PREFERRED EMBODIMENTS

Preferred embodiments of the method according to the present invention will be described in further detail by reference to the accompanying drawings.

Semiconductor Wafer Preparation Step

Figure 1:
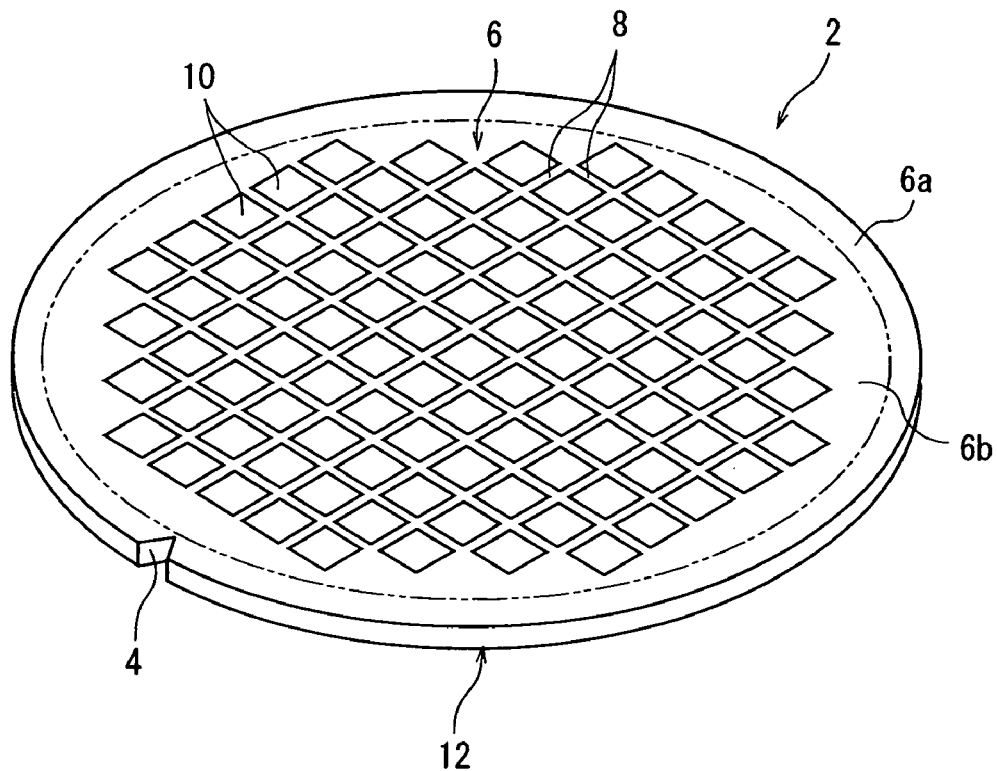
FIG. 1 is a perspective view showing a typical example of a semiconductor wafer used in the method of the present invention.

FIG. 1 shows a typical example of a semiconductor wafer used in the method of the present invention. A semiconductor wafer 2 well known per se is generally disk-shaped, and has an orientation notch 4 formed in a peripheral edge portion thereof. The thickness of the wafer 2 is uniform throughout, and may be of the order of, for example, 300 to 700 µm. On one surface, i.e., face 6, of the wafer 2, there are an annular peripheral edge region 6a present in an outer peripheral edge portion, and a circular main region 6b surrounded with the peripheral edge region 6a. The above notch 4 is formed in the peripheral edge region 6a. In the main region 6b, many rectangular regions 10 are defined by streets 8 arranged in a lattice pattern. A semiconductor device (not shown) is disposed in each of the rectangular regions 10. Each of the rectangular regions 10 constitutes a main semiconductor chip, as will become clear from descriptions to be offered later.

Circular Concavity Formation Step

Figure 2:
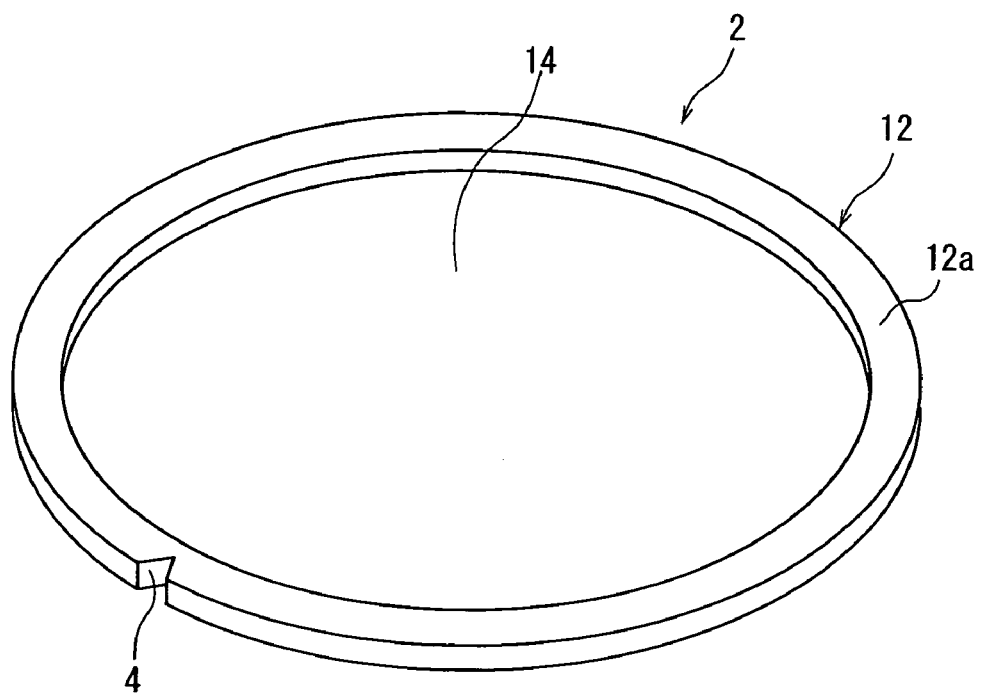
FIG. 2 a perspective view showing a state in which a circular concavity is formed in the back of the semiconductor wafer of FIG. 1.

Subsequently to the semiconductor wafer preparation step of preparing the semiconductor wafer 2, a circular concavity formation step is performed. In this circular concavity formation step, as shown in FIG. 2, a region in the other surface, i.e., the back 12, of the semiconductor wafer 2, except a peripheral edge region 12a corresponding to the peripheral edge region 6a of the face 6 (accordingly, the region corresponding to the main region 6b of the face 6), is ground to form a circular concavity 14 in the back 12 of the semiconductor wafer 2. Grinding for formation of the circular concavity 14 can be advantageously performed in the manner disclosed in the U.S. patent application Ser. No. 11/481,002 assigned to the assignee of the present application. The descriptions of the U.S. patent application Ser. No. 11/481,002 are incorporated herein.

Via Contact Means Formation Step

Figure 3:
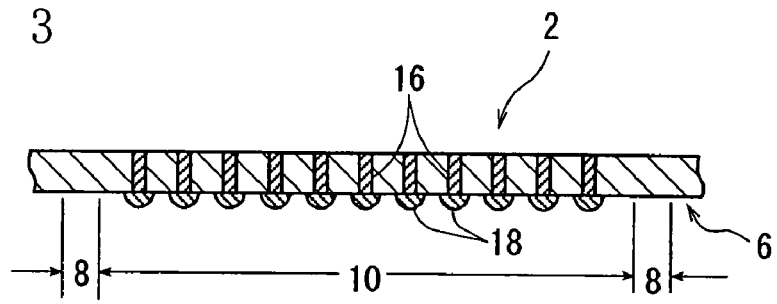
FIG. 3 is an enlarged partial sectional view showing a state in which via contact means and bumps are formed at required positions of the semiconductor wafer of FIG. 2.

Then, a via contact means formation step is performed. In the via contact means formation step, as shown in FIG. 3, a plurality of via contact means 16 are disposed in each of the many rectangular regions 10 of the semiconductor wafer 2. The via contact means 16, each of which may be of a well known form per se, can be disposed in a well known manner, for example, by forming a plurality of via holes penetrating the semiconductor wafer 2, and filling an electrically conductive substance into these via holes. On the face 6 of the semiconductor wafer 2, bumps 18 can be disposed in correspondence with the respective via contact means 16.

Semiconductor Chip Stacking Step

Figure 4:
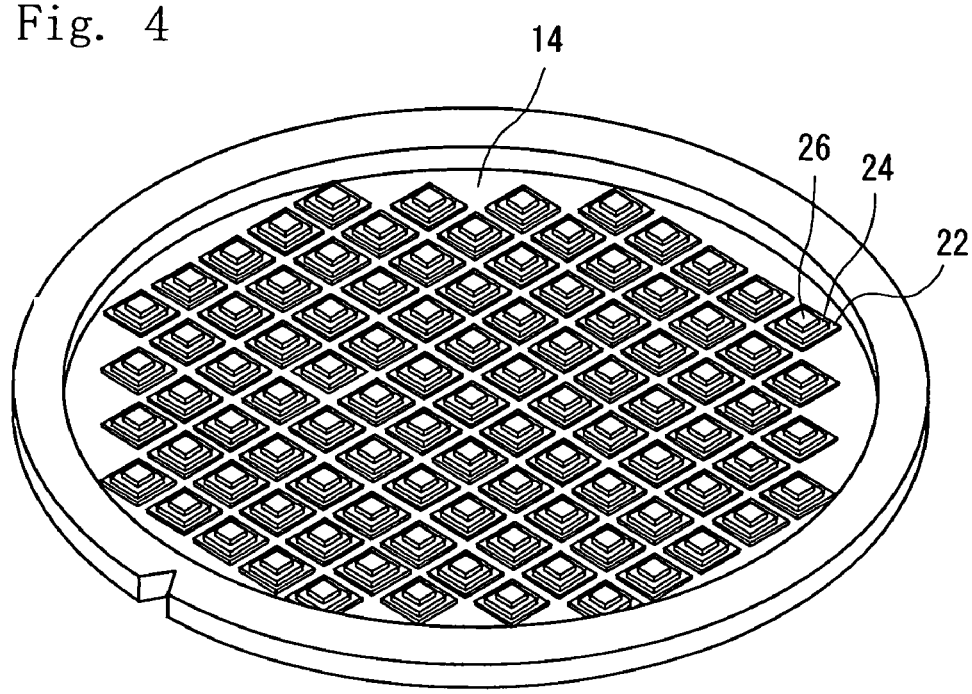
FIG. 4 is a perspective view showing a state in which three subsidiary semiconductor chips are stacked in each of required regions of the circular concavity of the semiconductor wafer of FIG. 3.
Figure 5:
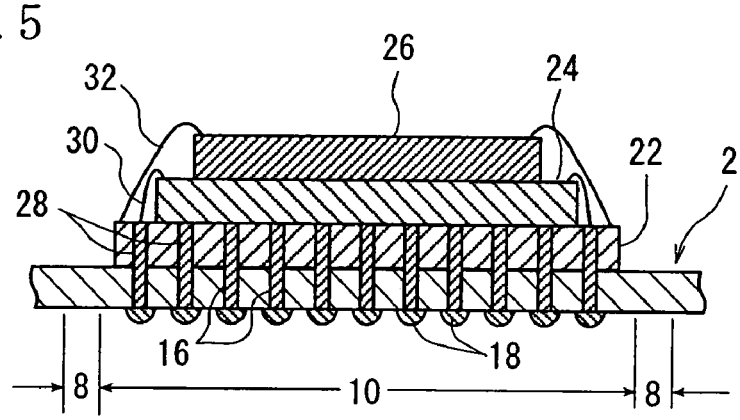
FIG. 5 is an enlarged partial sectional view showing a state in which the three subsidiary semiconductor chips are stacked in each of the required regions of the circular concavity of the semiconductor wafer of FIG. 3, and required wires are further disposed.

Subsequently to the via contact means formation step, there is performed a semiconductor chip stacking step of stacking at least one subsidiary semiconductor chip in each of many rectangular regions, which corresponds to each of the main rectangular regions 10 on the face 6, on the bottom surface of the circular concavity 14 of the semiconductor wafer 2. In embodiments illustrated in FIGS. 4 and 5, three subsidiary semiconductor chips, namely, a first subsidiary semiconductor chip 22, a second subsidiary semiconductor chip 24, and a third subsidiary semiconductor chip 26, are sequentially stacked in each of the many rectangular regions on the bottom surface of the circular concavity 14. The first subsidiary semiconductor chip 22 is somewhat smaller than the rectangular region 10, the second subsidiary semiconductor chip 24 is somewhat smaller than the first subsidiary semiconductor chip 22, and the third subsidiary semiconductor chip 26 is somewhat smaller than the second subsidiary semiconductor chip 24. As clearly shown in FIG. 5, the first subsidiary semiconductor chip 22 is stacked, with its face, where the semiconductor circuit is formed, being pointed toward the bottom surface of the circular concavity 14 (accordingly, with its face being pointed toward the back of the main semiconductor chip). Via contact means 28, each of which corresponds to each of the via contact means 16 formed in the semiconductor wafer 2, are disposed in the first subsidiary semiconductor chip 22. On the face of the first subsidiary semiconductor chip 22 (lower surface in FIG. 5), bumps in contact with the via contact means 16 (the bumps are not illustrated to avoid complicacy of the drawing) are disposed in correspondence with the respective via contact means 28. Advantageously, an underfilm (not shown), which is well known and is designed to prevent the formation of a clearance between the bottom surface of the circular concavity 14 and the face of the first subsidiary semiconductor chip 22, is stuck to the face of the first subsidiary semiconductor chip 22. The second subsidiary semiconductor chip 24 is stacked on the first subsidiary semiconductor chip 22, with the back of the second subsidiary semiconductor chip 24 being pointed toward the back of the first subsidiary semiconductor chip 22. A semiconductor circuit is formed on the face (upper surface in FIG. 5) of the second subsidiary semiconductor chip 24. The third subsidiary semiconductor chip 26 is stacked on the second subsidiary semiconductor chip 24, with the back of the third subsidiary semiconductor chip 26 being pointed toward the face of the second subsidiary semiconductor chip 24. A semiconductor circuit is formed on the face (upper surface in FIG. 5) of the third subsidiary semiconductor chip 26. The first subsidiary semiconductor chip 22, the second subsidiary semiconductor chip 24, and the third subsidiary semiconductor chip 26 may each be of a well known form, and thus their detailed explanations are omitted herein.

Wire Laying Step

In the illustrated embodiment, a wire laying step is performed subsequently to the semiconductor chip stacking step. In the wire laying step, there are laid a plurality of wires 30 for connecting the semiconductor circuit of the second subsidiary semiconductor chip 24 to the via contact means 16 formed in the semiconductor wafer 2, and a plurality of wires 32 for connecting the semiconductor circuit of the third subsidiary semiconductor chip 26 to the via contact means 16 formed in the semiconductor wafer 2.

Encapsulation Resin Formation Step

Figure 6:
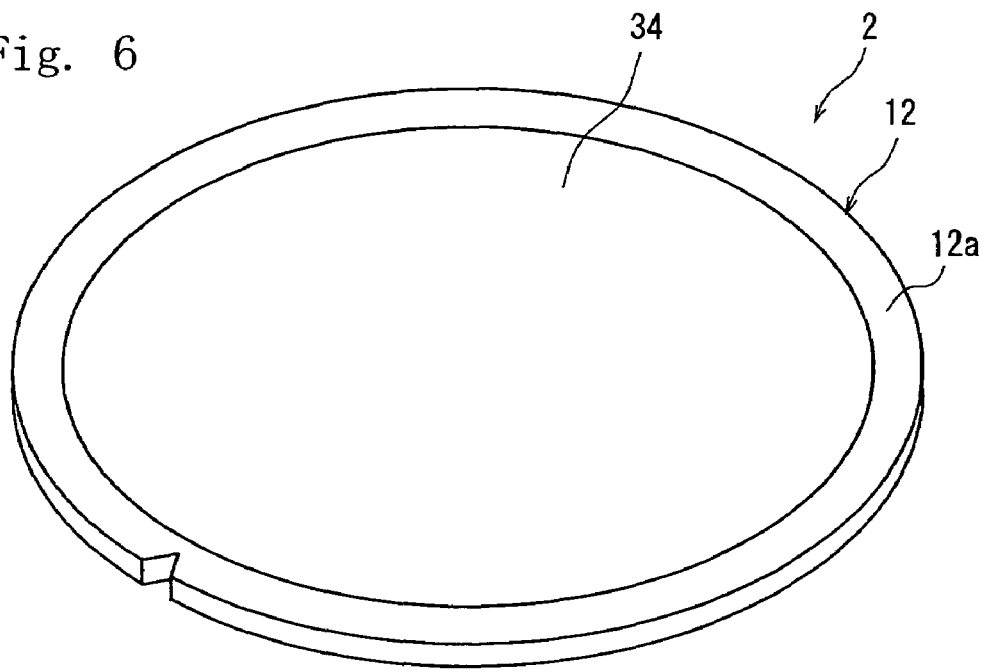
FIG. 6 is a perspective view showing a state in which an encapsulation resin is formed in the circular concavity of the semiconductor wafer of FIG. 5.
Figure 7:
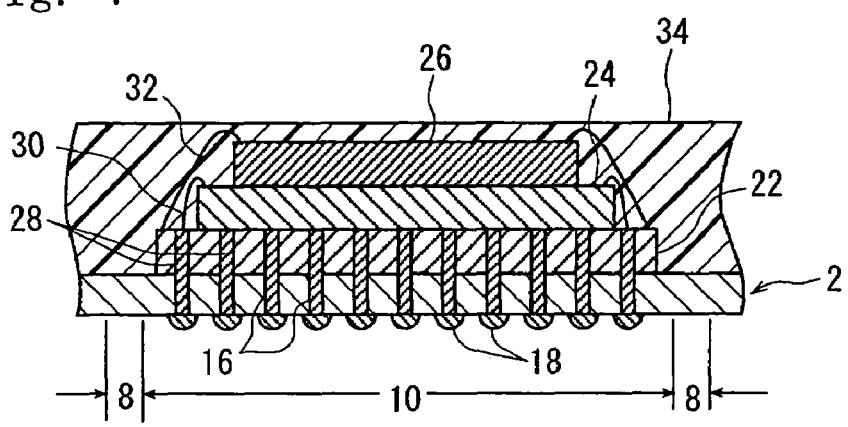
FIG. 7 is an enlarged partial sectional view of the semiconductor wafer of FIG. 6.

An encapsulation resin formation step is performed after the wire laying step. In the encapsulation resin formation step, as shown in FIGS. 6 and 7, a molten resin is filled into the circular concavity 14 formed in the back of the semiconductor wafer 2 to cover the first subsidiary semiconductor chip 22, the second subsidiary semiconductor chip 24, the third subsidiary semiconductor chip 26, and the wires 30 and 32 disposed in the circular concavity 14, and the filled resin is cured to form an encapsulation resin 34. As the encapsulation resin 34, a thermosetting resin, such as an epoxy resin, a silicone resin, or a polyimide resin, is used suitably. Such a thermosetting resin is cured by heating the resin after it is filled into the circular concavity 14. It is preferred that the upper surface of the molten resin filled into the circular concavity 14 be substantially at the same altitude as the plane of the peripheral edge region 12a remaining, without being ground, in the back 12 of the semiconductor wafer 2, or be somewhat lower than this plane.

In connection with the encapsulation resin formation step in the method of the present invention, it should be kept in mind that there is no need to use a mold; that since it suffices to pour the molten resin into the circular concavity 14, it is not difficult to fill the molten resin, even if the thickness of the encapsulation resin 34 is sufficiently small; and that there is no risk of wire breakage or short-circuiting due to deformation of the wires 30 and 32 during filling of the molten resin.

Separation Step

Figure 8:
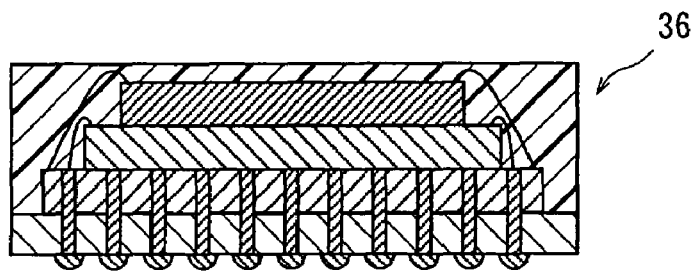
FIG. 8 is an enlarged sectional view showing a semiconductor package produced by cutting the semiconductor wafer of FIGS. 6 and 7, together with the encapsulation resin, along streets.

A separation step is performed subsequently to the encapsulation resin formation step. In such a separation step, the semiconductor wafer 2 and the encapsulation resin 34 formed in its circular concavity 14 are cut along the streets 8 in the face 6 of the semiconductor wafer 2, whereby many semiconductor packages 36 as shown in FIG. 8 are produced. The cutting of the semiconductor wafer 2 and the encapsulation resin 34 can be advantageously performed using an ordinary dicer for carrying out cutting with a thin annular blade rotated at a high speed, or a laser dicer for carrying out cutting by irradiation with a laser beam. Cutting with any of these dicers, namely, dicing, is itself well known among people skilled in the art, and thus its detailed explanation is omitted herein.

While the preferred embodiments of the method according to the present invention have been described in detail by reference to the accompanying drawings, it is to be understood that the invention is not limited to such embodiments, but various changes and modifications may be made without departing from the scope of the invention.

What I claim is:

1. A method for producing a semiconductor package including a main semiconductor chip having a semiconductor circuit formed on one surface thereof, at least one subsidiary semiconductor chip stacked on another surface of the main semiconductor chip, and an encapsulation resin covering the subsidiary semiconductor chip, comprising:
   a semiconductor wafer preparation step of preparing a semiconductor wafer which is generally disk-shaped, on whose one surface a peripheral edge region and a main region surrounded with the peripheral edge region are present, in the main region of which many rectangular regions are defined by streets arranged in a lattice pattern, and in each of the rectangular regions of which a semiconductor circuit constituting the main semiconductor chip is disposed;
   a circular concavity formation step of grinding other surface of the semiconductor wafer, except a peripheral edge region corresponding to the peripheral edge region on the one surface, after the preparation step, thereby forming a circular concavity in the other surface of the semiconductor wafer;
   a semiconductor chip stacking step of stacking at least one said subsidiary semiconductor chip on each of many rectangular regions, which corresponds to each of the rectangular regions, on a bottom surface of the circular concavity of the semiconductor wafer after the circular concavity formation step;
   an encapsulation resin formation step of filling a molten resin into the circular concavity of the semiconductor wafer, and curing the resin, after the semiconductor chip stacking step, thereby forming an encapsulation resin covering the subsidiary semiconductor chips; and
   a separation step of cutting the encapsulation resin, together with the semiconductor wafer, along the streets, to separate the semiconductor wafer and the encapsulation resin into many of the semiconductor packages.

2. The method according to claim 1, further comprising a via contact means formation step of forming a plurality of penetrating via contact means in each of the rectangular regions prior to the semiconductor chip stacking step.

3. The method according to claim 2, wherein a plurality of bumps connected to the via contact means are formed in each of the rectangular regions on the one surface of the semiconductor wafer in the via contact means formation step.

4. The method according to claim 2, further comprising a wire laying step of connecting a semiconductor circuit of the subsidiary semiconductor chip and the via contact means by electrically conductive wires after the semiconductor chip stacking step and before the encapsulation resin formation step.

* * * * *